United States Patent
Suzumura et al.

(10) Patent No.: US 10,978,394 B2
(45) Date of Patent: Apr. 13, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Naohito Suzumura, Tokyo (JP); Kazuyuki Omori, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/521,090

(22) Filed: Jul. 24, 2019

(65) Prior Publication Data
US 2020/0043857 A1 Feb. 6, 2020

(30) Foreign Application Priority Data
Aug. 2, 2018 (JP) .............................. JP2018-145868

(51) Int. Cl.
*H01L 23/52* (2006.01)
*H01L 23/532* (2006.01)
*H01L 21/768* (2006.01)

(52) U.S. Cl.
CPC .. *H01L 23/53238* (2013.01); *H01L 21/76831* (2013.01); *H01L 21/76834* (2013.01); *H01L 21/76877* (2013.01)

(58) Field of Classification Search
CPC ......... H01L 23/53238; H01L 21/76831; H01L 21/76834; H01L 21/76877
See application file for complete search history.

(56) References Cited

U.S. PATENT DOCUMENTS

| 8,043,957 | B2 | 10/2011 | Tada et al. |
| 8,188,600 | B2 | 5/2012 | Kmano et al. |
| 9,337,093 | B2 | 5/2016 | Oshida et al. |

FOREIGN PATENT DOCUMENTS

| JP | 2011-199059 A | 10/2011 |
| JP | 2012-023245 A | 2/2012 |
| JP | 2013-093602 A | 5/2013 |
| WO | 2006/001356 A1 | 1/2006 |

*Primary Examiner* — Victor A Mandala
*Assistant Examiner* — Colleen E Snow
(74) *Attorney, Agent, or Firm* — McDermott Will & Emery LLP

(57) ABSTRACT

In the semiconductor device, a first defect formation preventing film is formed on the first wiring side, and a second defect formation preventing film is formed on the second wiring side. when a ratio of an infrared absorption intensity corresponding to a bond between silicon and hydrogen to an infrared absorption intensity corresponding to a bond between silicon and oxygen is defined as an abundance ratio, the abundance ratio in the first defect formation preventing film is smaller than the abundance ratio in the second interlayer insulating film. The abundance ratio in the second defect formation preventing film is smaller than the abundance ratio in the second interlayer insulating film.

12 Claims, 19 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2018-145868 filed on Aug. 2, 2018 including the specification, drawings and abstract is incorporated herein by reference in its entirety.

BACKGROUND

The present invention relates to a semiconductor device and method of manufacturing the same, and the present invention can be suitably applied to, for example, a semiconductor device having a multi-layer wiring structure having a Low-k film.

In a semiconductor device equipped with a flash memory and a microcomputer, for example, a relatively high voltage of 10 V or more is applied to a wiring. For this reason, in such a semiconductor device, it is essential to ensure reliability against Time Dependent Dielectric Breakdown (TDDB). The time-dependent dielectric breakdown is a phenomenon in which dielectric breakdown occurs in a relatively low electric field such as an actual use state with the passage of time even when the dielectric breakdown strength of the insulating film is relatively high.

Japanese Unexamined Patent Application Publication No. 2013-93602, WO 2006/001356, Japanese Unexamined Patent Application Publication No. 2012-23245, and Japanese Unexamined Patent Application Publication No. 2011-199059 propose to increase reliability in the wiring, and in particular, Japanese Unexamined Patent Application Publication No. 2013-93602 and Japanese Unexamined Patent Application Publication No. 2012-23245 propose to increase reliability for TDDB between one wiring and another wiring located in the same layers.

In order to cope with miniaturization of electronic devices, miniaturization of semiconductor device is required. In order to miniaturize the semiconductor device, it is required to form the interlayer insulating film to have a small thickness. For this reason, it is required to ensure the reliability with respect to the TDDB between the wiring located in the layers differing from each other.

For one wiring and the other wiring located in the same layers, electric dielectric resistance can be ensured by increasing the wiring spacing at the designing stage. However, for one wiring, if other wiring is located in a different layer than its one wiring, the spacing between one wiring and the other wiring is determined by the semiconductor device structural design, and therefore the spacing cannot be easily expanded. In addition, in the miniaturized semiconductor device, regardless of a polarity of the voltage applied to the wiring, in addition to the TDDB between the wirings located in the same layer, it is also required to ensure reliability with respect to the TDDB between the wirings located in different layers.

Other objects and novel features will become apparent from the description of this specification and the accompanying drawings.

SUMMARY

The semiconductor device according to embodiments includes a first wiring, a second wiring, a first defect forming preventing film, and a second defect forming preventing film. The first wiring is formed in a first trench of a first interlayer insulating film. The second wiring is disposed above/over the first wiring and is formed in a second trench of a second interlayer insulating film. The first defect formation preventing film is formed between the first wiring and the second interlayer insulating film. The second defect formation preventing film is formed between the second interlayer insulating film and the second wiring. A ratio of an infrared absorption intensity corresponding to a bond between silicon and hydrogen to the infrared absorption intensity corresponding to the bond between silicon and oxygen is defined as an abundance ratio. The abundance ratio of the first defect formation preventing film is smaller than the abundance ratio of the second interlayer insulating film. The abundance ratio of the second defect formation preventing film is smaller than the abundance ratio of the second interlayer insulating film.

A method of manufacturing the semiconductor device according to another embodiment includes the following steps. A first interlayer insulating film having a first trench is formed so as to cover the semiconductor substrate. A first wiring is formed in the first trench. A first insulating film is formed to cover the first wiring. A first plasma treatment is performed on the first insulating film to form a first defect formation preventing film. A second interlayer insulating film having a second trench is formed so as to cover the first defect formation preventing film. A second defect formation preventing film is formed by performing a second plasma treatment on the second interlayer insulating film while leaving a portion of the second interlayer insulating film. A second wiring is formed in the second trench. The ratio of the infrared absorption intensity corresponding to the bond between silicon and hydrogen to the infrared absorption intensity corresponding to the bond between silicon and oxygen is defined as the abundance ratio. In the forming the first defect formation preventing film, the first defect formation preventing film is formed such that the abundance ratio of the first defect formation preventing film is smaller than the abundance ratio of the second interlayer insulating film. In the forming the second defect formation preventing film, the second defect formation preventing film is formed such that the abundance ratio of the second defect formation preventing film is smaller than the abundance ratio of the second interlayer insulating film.

According to the semiconductor device of embodiments, a reliability of the TDDB between the first wiring and the second wiring can be improved.

According to the manufacturing method of the semiconductor device according to another embodiment, it is possible to produce a semiconductor device capable of improving the reliability of the TDDB between the first wiring and the second wiring.

DETAILED DESCRIPTION

The main part of a semiconductor device according to first embodiment will be explained.

Figure 1:
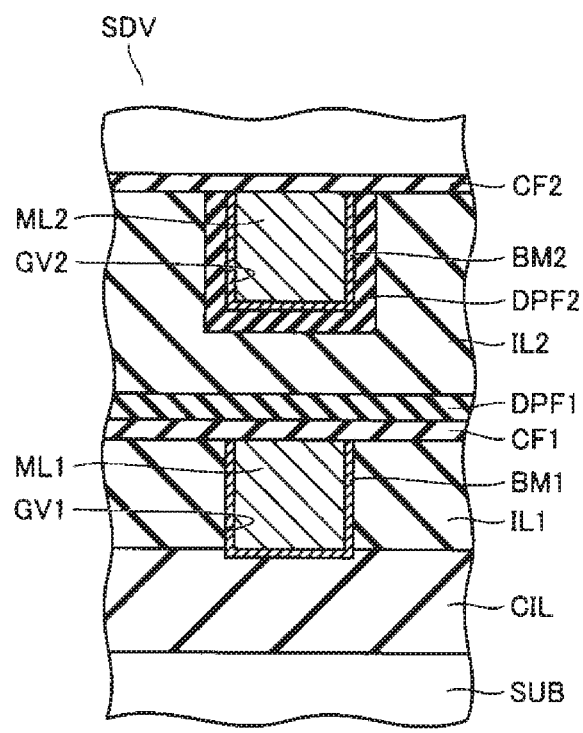
FIG. 1 is a partial cross-sectional view of a semiconductor device according to first embodiment.

As shown in FIG. 1, in the semiconductor device SDV, a contact interlayer insulating film CIL is formed so as to cover a semiconductor substrate SUB. A first interlayer insulating film IL1 is formed so as to cover the contact interlayer insulating film CIL. An ordinary silicon oxide film (SiO2) is formed as the contact interlayer insulating film CIL. A dielectric constant k of the silicon oxide film is about 4.2 to 4.3.

A first interlayer insulating film IL1 is formed so as to cover the contact interlayer insulating film CIL. As the first interlayer insulating film IL1, a Low-k film having a dielectric constant k lower than the dielectric constant k of a normal silicon oxide film is used, and a silicon oxide carbide (SiOC) film is formed here. The dielectric constant k of the silicon acid carbide film is about 2.5 to 2.7.

A first wiring ML1 is formed on a sidewall surface and a bottom surface of a first wiring trench GV1 formed in the first interlayer insulating film IL1 with the first barrier metal film BM1 interposed therebetween. As the first barrier metal film BM1, for example, a tantalum (Ta) film is formed. As the first wiring ML1, a copper (Cu) film is formed.

A first capping insulating film CF1 is formed so as to cover the first wiring ML1. As the first capping insulating film CF1, for example, a silicon carbonitride (SiCN) film is formed. A first defect formation preventing film DPF1 is formed so as to cover the first cap insulating film CF1. As described later, the first defect formation preventing film DPF1 is formed by performing oxygen-plasma treatment on a silicon oxycarbide film.

Figure 9:
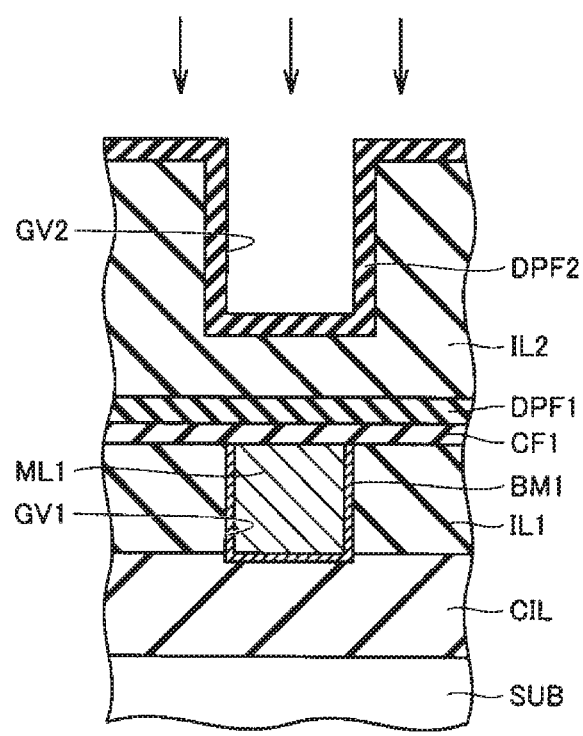
FIG. 9 is, in the embodiment, a partial cross-sectional view illustrating a step performed after the step illustrated in FIG. 8.

A second interlayer insulating film IL2 is formed so as to cover the first defect formation preventing film DPF1. As the second interlayer insulating film IL2, for example, a silicon oxide carbide (SiOC) film is formed. The dielectric constant k of the silicon acid carbide film is about 2.5 to 2.7. A second defect formation preventing film DPF2 is formed along a side wall surface and a bottom surface of the second wiring trench GV2 formed in the second interlayer insulating film IL2. As described later, the second defect formation preventing film DPF2 is formed by performing an oxygen-plasma treatment on the second interlayer insulating film IL2 in which the second wiring trench GV2 is formed, as shown in FIG. 9.

A second wiring ML2 is formed on the sidewall surface and the bottom surface of the second wiring trench GV2 formed in the second interlayer insulating film IL2 with the second barrier metal film BM2 interposed therebetween. As the second barrier metal film BM2, for example, a tantalum (Ta) film is used. As the second wiring ML2, a copper (Cu) film is applied. The second defect formation preventing film DPF2 is positioned so as to face the side surface and the bottom surface of the second wiring ML2.

A second capping insulating film CF2 is formed so as to cover the second wiring ML2. As the second capping insulating film CF2, for example, a silicon carbonitride film (SiCN) is formed. A wiring and an interlayer insulating film (not shown) are further formed on the second capping insulating film CF2. Basic multi-layer wiring structures in the semiconductor device SDV is configured as described above.

Figure 2:
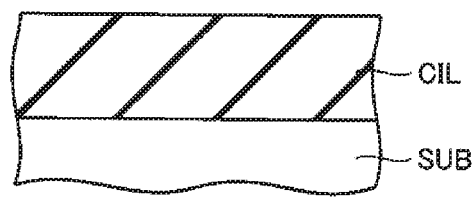
FIG. 2 is, in the embodiment, a partial cross-sectional view illustrating one step of a method of manufacturing the semiconductor device.

Next, an exemplary manufacturing method of the above-described semiconductor device will be described. Certain semiconductors (not shown) such as transistors are formed on the semiconductor substrate SUB (see FIG. 2). Next, as shown in FIG. 2, a silicon oxide film (SiO2) is formed by, e.g., Chemical Vapor Deposition (CVD) so as to cover the semiconductor substrate SUB, thereby forming a contact interlayer insulating film CIL.

Figure 3:
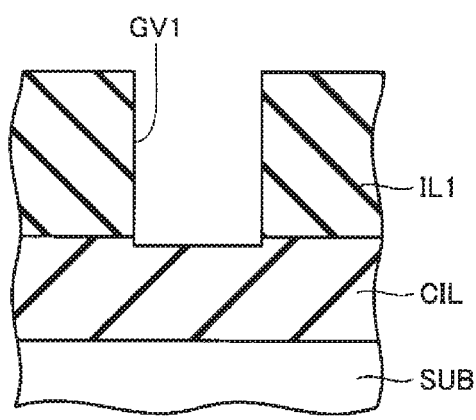
FIG. 3 is, in the embodiment, a partial cross-sectional view illustrating a step performed after the step illustrated in FIG. 2.

Next, a silicon oxide carbide film is deposited by, e.g., CVD so as to cover the contact interlayer insulating film CIL, thereby forming a first interlayer insulating film IL1 as shown in FIG. 3. Next, predetermined photolithography processing and etching processing are performed. As a result, as shown in FIG. 3, a first wiring trench GV1 is formed in the first interlayer insulating film IL1.

Figure 4:
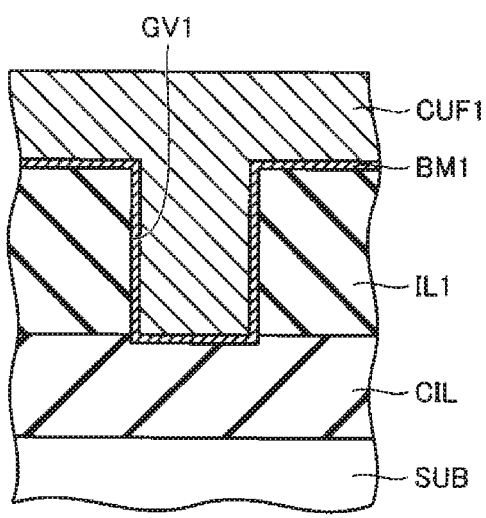
FIG. 4 is, in the embodiment, a partial cross-sectional view illustrating a step performed after the step illustrated in FIG. 3.

Next, as shown in FIG. 4, by depositing a tantalum film by, for example, sputtering, a first barrier metal film BM1 is formed so as to cover the side wall surface and the bottom surface of the first wiring trench GV1. Next, a cuprous film CUF1 is formed by plating so as to fill the first wiring trench GV1.

Figure 5:
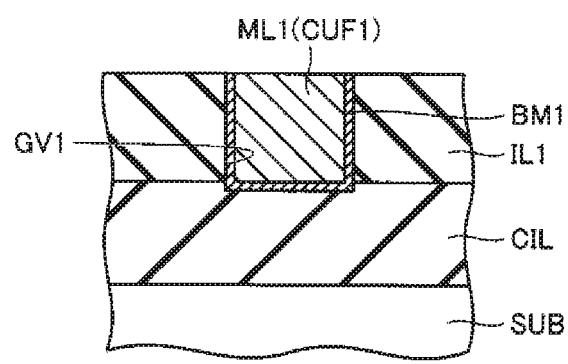
FIG. 5 is, in the embodiment, a partial cross-sectional view illustrating a step performed after the step illustrated in FIG. 4.

Next, as shown in FIG. 5, chemical mechanical polishing (CMP) is performed to remove a portion of the first barrier metal film BM1 and a portion of the first copper film CUF1 located on an upper surface of the first interlayer insulating film IL1, leaving a portion of the first barrier metal film BM1 and a portion of the first copper film CUF1 located in the first wiring trench GV1. Thus, the first wiring ML1 is formed in the first wiring trench GV1.

Figure 6:
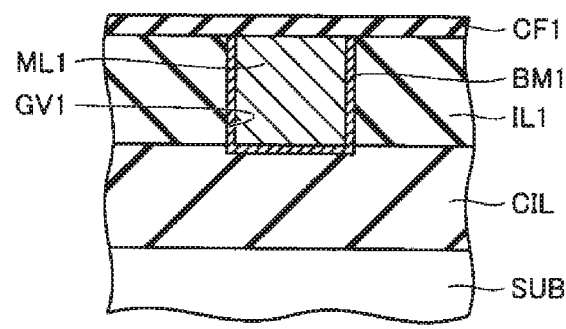
FIG. 6 is, in the embodiment, a partial cross-sectional view illustrating a step performed after the step illustrated in FIG. 5.
Figure 7:
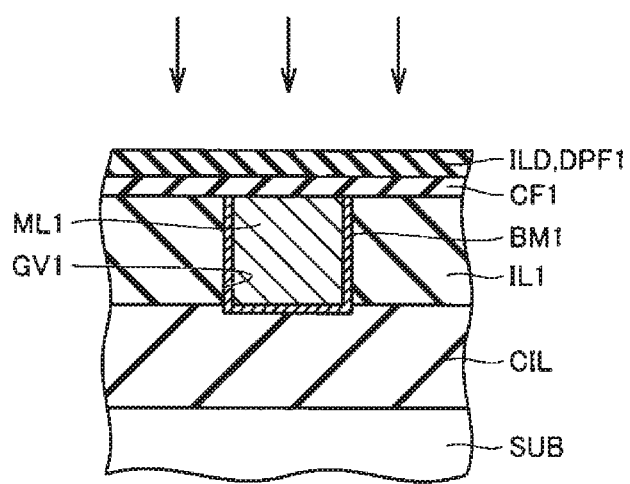
FIG. 7 is, in the embodiment, a partial cross-sectional view illustrating a step performed after the step illustrated in FIG. 6.

Next, as shown in FIG. 6, the silicon oxide carbide film is deposited by, for example, CVD method so as to cover the first wiring ML1, thereby forming the first cap insulating film CF1. Next, as shown in FIG. 7, the silicon oxycarbide film ILD is formed by, for example, CVD method so as to cover the first capping insulating film CF1. Next, the silicon oxycarbide film ILD is subjected to a first oxygen plasma treatment.

As the oxygen plasma, plasma is generated from a gas containing at least one of an oxygen atom or a carbon atom. The silicon oxycarbide film ILD is exposed to the atmosphere of the plasma. As a gas containing at least one of oxygen atoms or carbon atoms, an oxygen gas (O2), a carbon dioxide gas (CO2), or a mixed gas of oxygen gas and carbon dioxide gas is preferably used.

When oxygen gas is used, the plasma can be generated under conditions of a flow rate of, for example, about 200 sccm or less, a power of, for example, about 200 to 1000 W, and a pressure of, for example, about 2.0 to 5.3 Pa. The temperature condition is set to, for example, room temperature (25° C.). The plasma processing time is set to, for example, about 5 to 15 seconds.

By performing the first oxygen plasma treatment on the silicon oxycarbide film ILD, the silicon oxycarbide film ILD is modified to form a first defect formation preventing film DPF1 for preventing the formation of defects. Here, the ratio of the integrated absorption intensity of infrared rays corresponding to the bond between silicon and hydrogen to the integrated absorption intensity of infrared rays corresponding to the bond between silicon and oxygen is defined as an abundance ratio (Si—H/Si—O). Then, the abundance ratio (Si—H/Si—O) in the first defect-formation preventing film DPF1 becomes smaller than the abundance ratio (Si—H/Si—O) in the second interlayer insulating film IL2 (see FIG. 8) to be formed later.

The infrared-ray absorption spectrum was measured by the attenuated total reflection (Attenuated Total Reflectance; ATR) method using, for example, a Fourier transform spectrophotometer (manufactured by Mattson Technology Corporation; Infinity Series). As the measurement conditions by the Fourier transform spectrophotometer, for example, the following measurement conditions were used. Unpolarized light was used. The resolution was 4 centimeters −1. The number of integrations was set to 256. The infrared integrated absorption strength of the Si—H coupling was obtained by, for example, calculating an integrated value in the obtained infrared absorption spectrum with a wave number ranging from 2100 $cm^{-1}$ to 2300 $cm^{-1}$. Infrared integrated absorption intensity of the Si—O bond was obtained, for example, by calculating integrated values in the obtained infrared absorption spectra with wave numbers ranging from 1000 cm to 1200 $cm^{-1}$.

Figure 8:
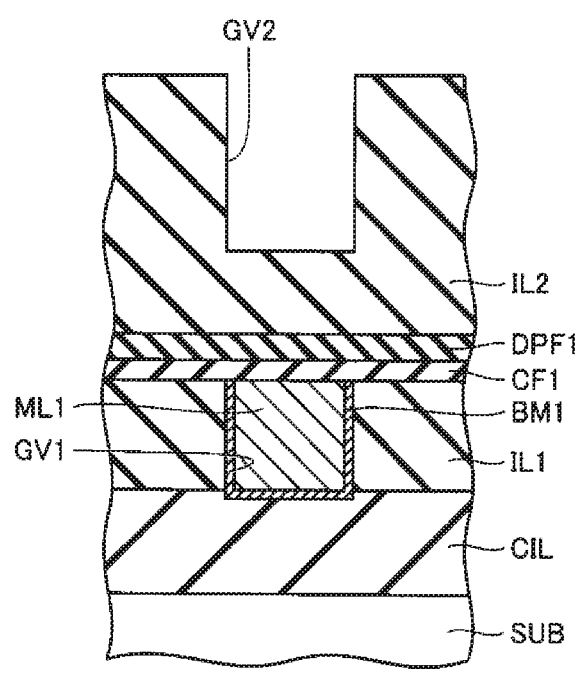
FIG. 8 is, in the embodiment, a partial cross-sectional view illustrating a step performed after the step illustrated in FIG. 7.

Next, a silicon oxide carbide film is deposited by, for example, a CVD method so as to cover the first defect formation preventing film DPF1, thereby forming a second interlayer insulating film IL2 as shown in FIG. 8. Next, predetermined photolithography processing and etching processing are performed. As a result, as shown in FIG. 8, the second wiring trench GV2 is formed in the second interlayer insulating film IL2.

Next, a second oxygen-plasma treatment is performed on the surface of the second interlayer insulating film IL2 including the sidewall surface and the bottom surface of the second wiring trench GV2. The conditions of the second oxygen plasma treatment are substantially the same as those of the first oxygen plasma treatment described above. As shown in FIG. 9, the surface of the second interlayer insulating film IL2 is subjected to a second oxygen-plasma treatment, whereby the surface of the silicon oxide carbide film is modified to, for example, about 20 nm to form a second defect formation preventing film DPF2 which prevents the formation of defects. The abundance ratio (Si—H/Si—O) in the second defect formation preventing film DPF2 is smaller than the abundance ratio (Si—H/Si—O) in the second interlayer insulating film IL2.

Figure 10:
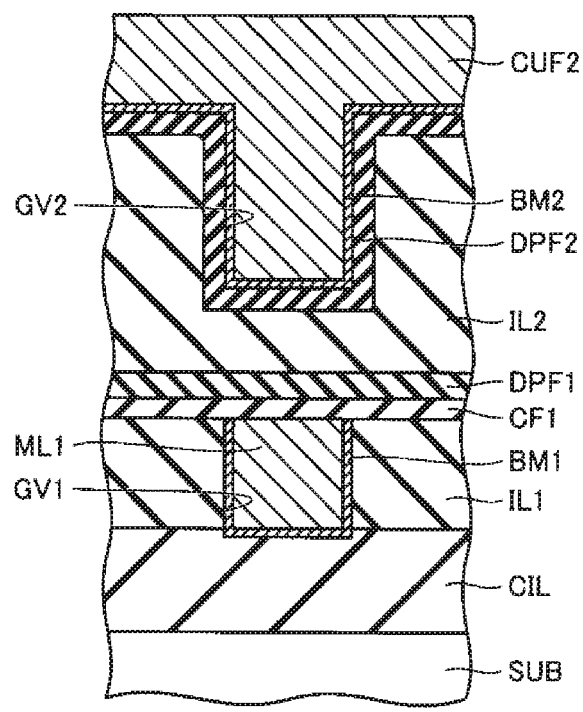
FIG. 10 is, in the embodiment, a partial cross-sectional view illustrating a step performed after the step illustrated in FIG. 9.

Next, as shown in FIG. 10, by depositing a tantalum film by, for example, sputtering, a second barrier metal film BM2 is formed so as to cover the side wall surface and the bottom surface of the second wiring trench GV2. Next, a cupric film CUF2 is formed by plating so as to fill the second wiring trench GV2.

Figure 11:
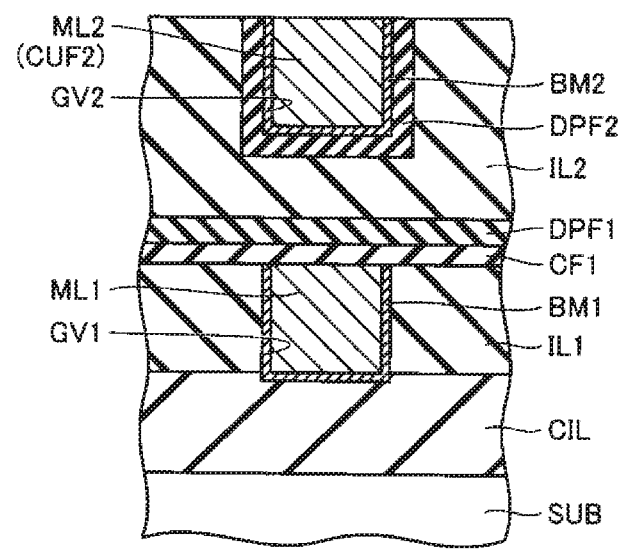
FIG. 11 is, in the embodiment, a partial cross-sectional view illustrating a step performed after the step illustrated in FIG. 10.

Next, as shown in FIG. 11, chemical mechanical polishing is performed to remove a portion of the second barrier metal film BM2 and a portion of the second copper film CUF2 located on the upper surface of the second interlayer insulating film IL2, leaving a portion of the second barrier metal film BM2 and a portion of the second copper film CUF2 located in the second wiring trench GV2. Thus, a second wiring ML2 is formed in the second wiring trench GV2.

Figure 12:
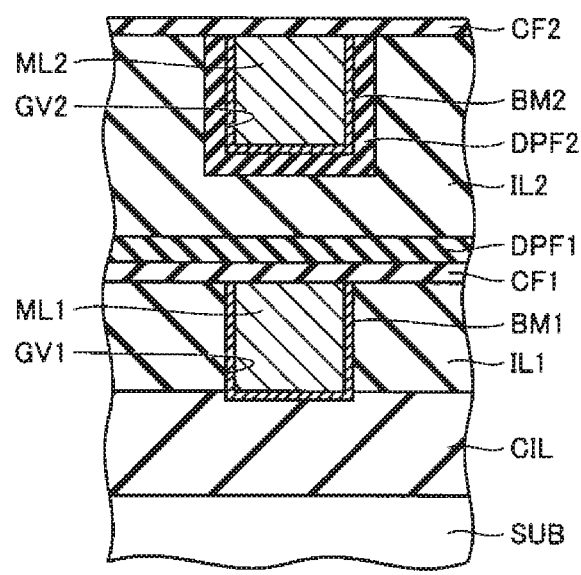
FIG. 12 is, in the embodiment, is a partial cross-sectional view illustrating a step performed after the step illustrated in FIG. 11.

Next, as shown in FIG. 12, a silicon oxide carbide film is deposited by, for example, a CVD method so as to cover the second wiring ML2, thereby forming a second cap insulating film CF2. Thereafter, an upper layer wiring and an interlayer insulating film are formed as required to complete main portions of the semiconductor device shown in FIG. 1.

In the semiconductor device SDVs described above, the first defect formation preventing film DPF1 and the second defect formation preventing film DPF2 are formed between the first wiring ML1 and the second wiring ML2. This can improve the TDDB between the first wiring ML1 and the second wiring ML2. This will be explained.

Each of the first defect formation preventing film DPF1 and the second defect formation preventing film DPF2 is formed by performing oxygen-plasma treatment on the silicon oxycarbide film to modify a part of the silicon oxycarbide film.

First, the evaluation by the infrared absorption spectrum of the silicon oxycarbide film accompanying the plasma treatment and the like performed by the inventors will be described. Three samples of Sample A, Sample B, and Sample C were prepared as samples. Sample A is a silicone acid carbonized film on which a silicone acid carbonized film was formed and then subjected to a treatment of irradiating ultraviolet rays. Sample B is a silicon oxycarbide film on which a nitrogen plasma treatment was performed after forming a silicon oxycarbide film. Sample C is a silicon oxycarbide film on which an oxygen plasma treatment was performed after forming a silicon oxycarbide film.

Figure 13:
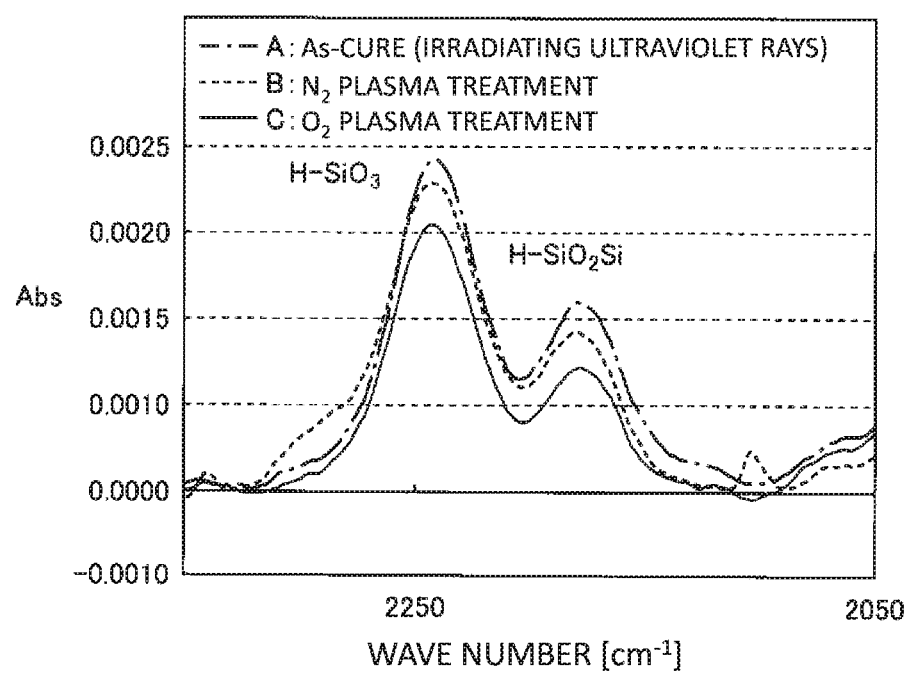
FIG. 13 is an infrared absorption spectrum of a silicon carbonate film in the embodiment.
Figure 14:
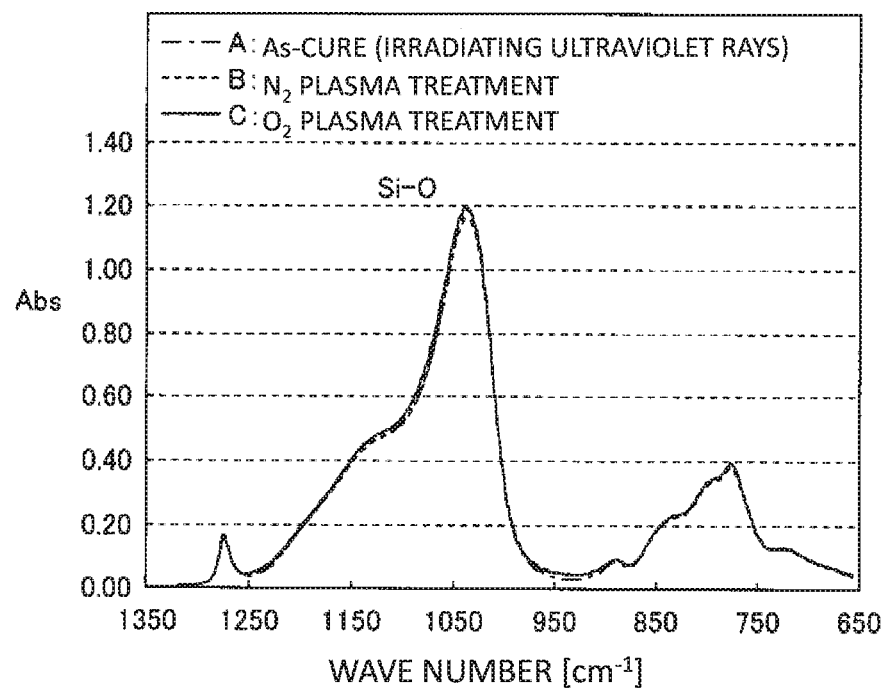
FIG. 14 is an infrared absorption spectrum of a silicon carbonate film in the embodiment.

The infrared absorption spectra of each of Samples A to C were measured using the Fourier transform spectrophotometer described above. The infrared absorption spectra of Samples A to C are shown in FIGS. 13 and 14. In FIG. 13, portions of the IR-absorption spectra corresponding to the bonds between the SiO3 and H and the bonds between the SiO2 Si and H, respectively, are shown. In FIG. 14, a portion of the infrared absorption spectrum corresponding to the bonding between Si and O is shown. The horizontal axis of the graph represents the wave number (inverse of the wavelength), and the vertical axis represents the absorbance (Abs) of infrared rays.

As shown in FIG. 13, in the infrared absorption spectrum corresponding to the bond between SiO3 and H and the infrared absorption spectrum corresponding to the bond between SiO2 Si and H, the absorbance decreases in the order of Sample A, Sample B, and Sample C. On the other hand, as shown in FIG. 14, in the portion of the infrared absorption spectrum corresponding to the bond between Si and O, it can be seen that the absorbance of the sample C is higher than that of the samples A and B.

Next, the inventors evaluated the absorption intensity of infrared light in order to quantify the difference in absorbance. The absorption intensity was calculated as the integrated absorption intensity based on the peak height of the infrared absorption spectrum and the baseline. The integrated absorption intensity of the peak portion of the infrared-ray absorption spectrum corresponding to the bond between the SiO3 and H is defined as the integrated absorption intensity S1. The integrated absorption intensity of the peak portion of the infrared absorption spectrum corresponding to the bond between the SiO2 Si and H is defined as the integrated absorption intensity S2. The integrated absorption intensity of the peak portion of the infrared absorption spectrum corresponding to the bond between Si and O is defined as the integrated absorption intensity S3.

Figure 15:
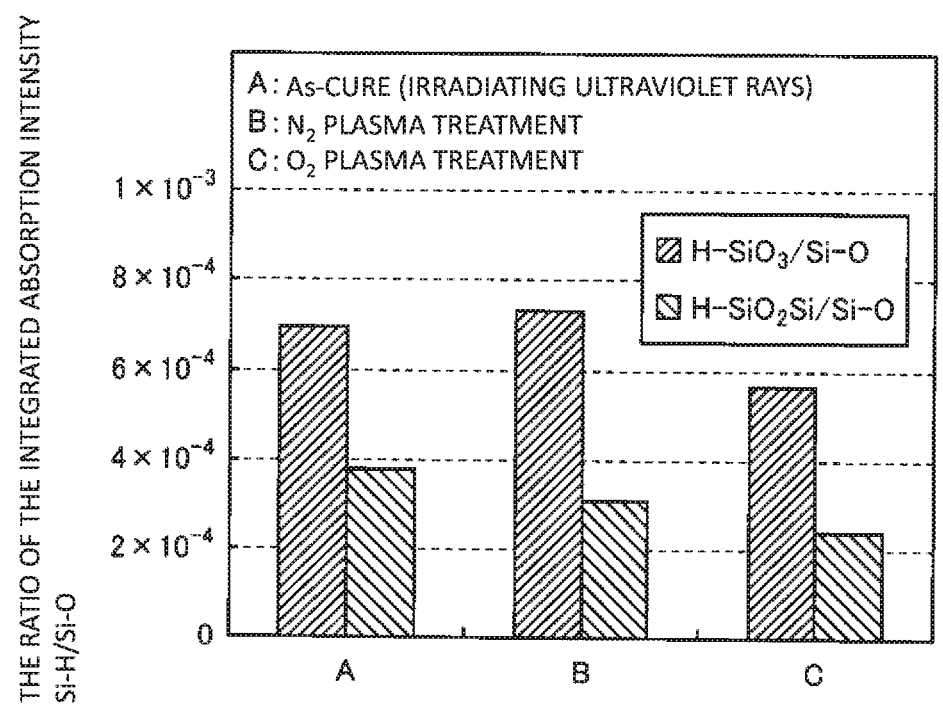
FIG. 15 is, in the embodiment, a graph showing a ratio of a predetermined integrated absorption intensity in the infrared absorption spectrum.

Then, the abundance ratio (Si—H/Si—O) which is the ratio of the integrated absorption intensity of the infrared rays corresponding to the bonding of the silicon and the hydrogen to the integrated absorption intensity of the infrared rays corresponding to the bonding of the silicon and the oxygen described above is represented by the integrated absorption intensity S1/integrated absorption intensity S3 or the integrated absorption intensity S2/integrated absorption intensity S3. FIG. 15 is a graph showing the abundance ratio of each of the silicon acid carbonized films of Sample A, Sample B, and Sample C.

As shown in FIG. 15, it can be seen that the abundance ratio in Sample C is smaller than the abundance ratio in Sample A. It is also understood that the abundance ratio in Sample C is smaller than that in Sample B. From this, it can be understood that, by performing the oxygen-plasma treatment on the silicon oxycarbide film, the ratio of forming bonds of Si—O having relatively greater bonding energies than the bonding of Si—H in the silicon oxycarbide film is increased.

In this manner, a portion (film) of the silicon oxycarbide film in which a rate of formation of bonds of a Si—O having relatively high bonding energies is greater than that of other portions is referred to herein as a defect formation preventing film from the viewpoint of its function. Next, the function of the defect formation preventing film will be described. We used Test Element Group (TEG) to evaluate the TDDB between wiring located in different layers.

Two patterns were employed as TEG patterns. The first pattern is a pattern in which a comb-shaped lower layer wiring and a comb-shaped upper layer wiring are arranged so as to cross each other in plan view. The second pattern is a pattern in which the comb-shaped lower layer wiring and the comb-shaped upper layer wiring are arranged so as to overlap in plan view. The electric field applied between the upper layer wiring and the lower layer wiring was set to 6.0 MV/cm to 8.0 MV/cm. The temperature was set between 25° C. and 175° C.

Figure 16:
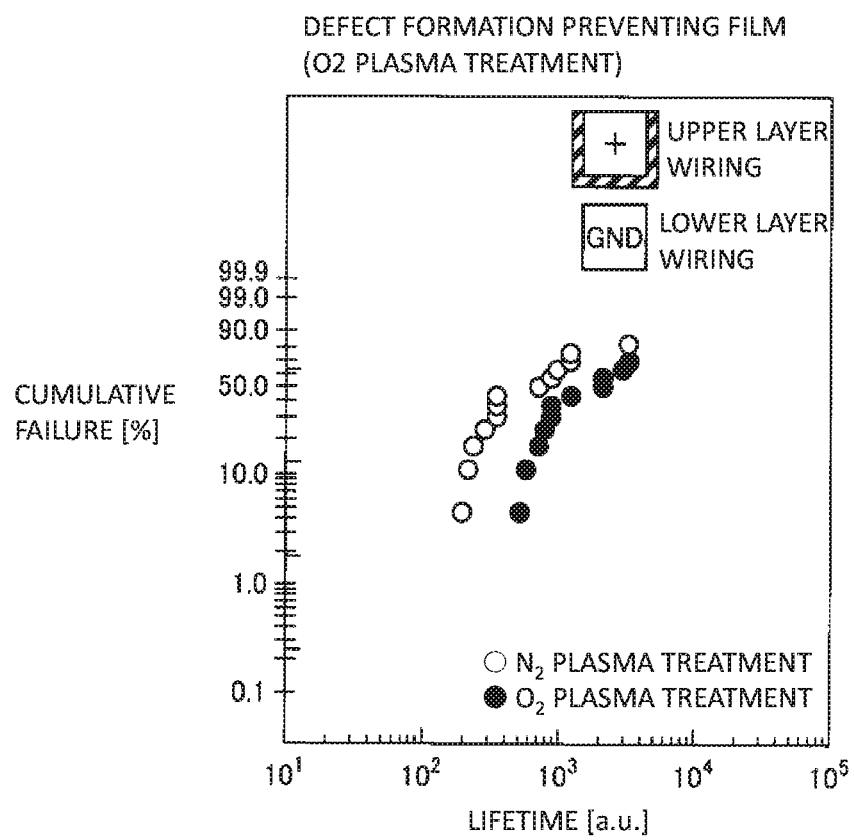
FIG. 16 is a first diagram illustrating a result of an assessment of TDDB according to the embodiment.
Figure 17:
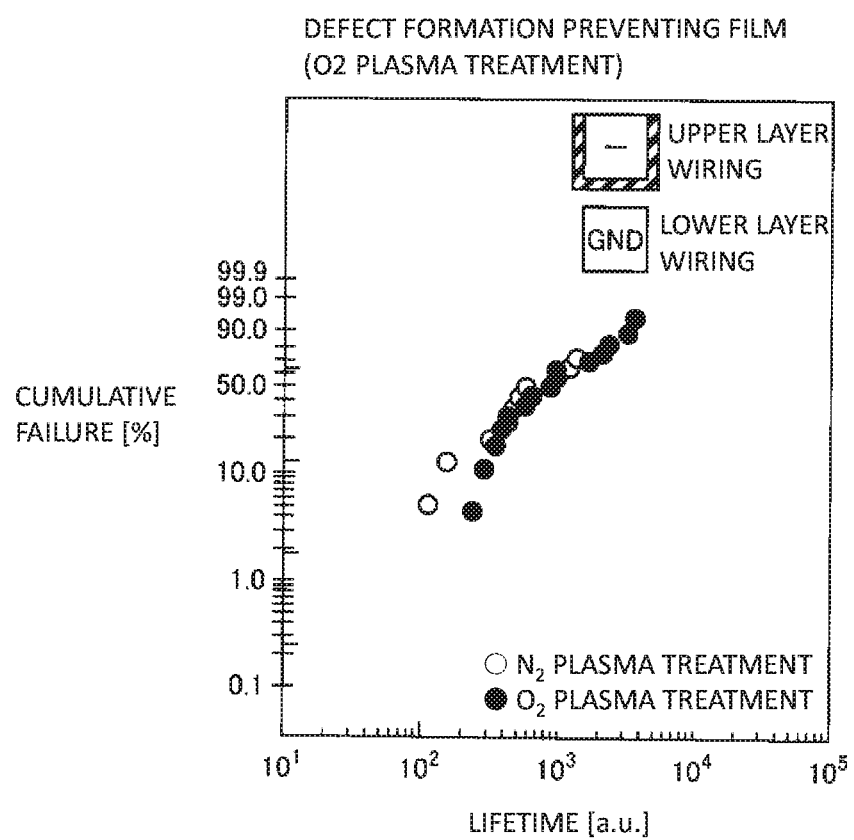
FIG. 17 is a second diagram illustrating a result of an assessment of TDDB according to the the embodiment.

In order to confirm the dependency of the polarities, the structure of the TEG was such that the defect formation preventing film was disposed on the upper layer wiring side and the defect formation preventing film was not disposed on the lower layer wiring side. The defect-formation preventing film is formed so as to face the bottom surface and both side surfaces of the upper layer wiring. FIGS. 16 and 17 show the results of evaluating the TDDB. FIG. 16 shows a result of evaluating the TDDB when positive voltage is applied to the upper layer wiring with the lower layer wiring as the grounding potential. FIG. 17 shows a result of evaluating the TDDB when negative voltage is applied to the upper layer wiring with the lower layer wiring as the grounding potential.

As shown in FIG. 16, in the TEG in which the defect formation preventing film was formed by the oxygen plasma treatment, when a positive voltage was applied to the upper layer wiring, compared with the TEG in which the nitrogen plasma treatment was performed, it was confirmed that the lifetime was shifted toward the high lifetime side and the lifetime was extended.

On the other hand, as shown in FIG. 17, it was confirmed that when a negative voltage was applied to the upper layer wiring, the lifetime of the TEG on which the oxygen plasma treatment was performed to form the defect formation preventing film and the lifetime of the TEG on which the nitrogen plasma treatment was performed hardly changed.

Figure 18:
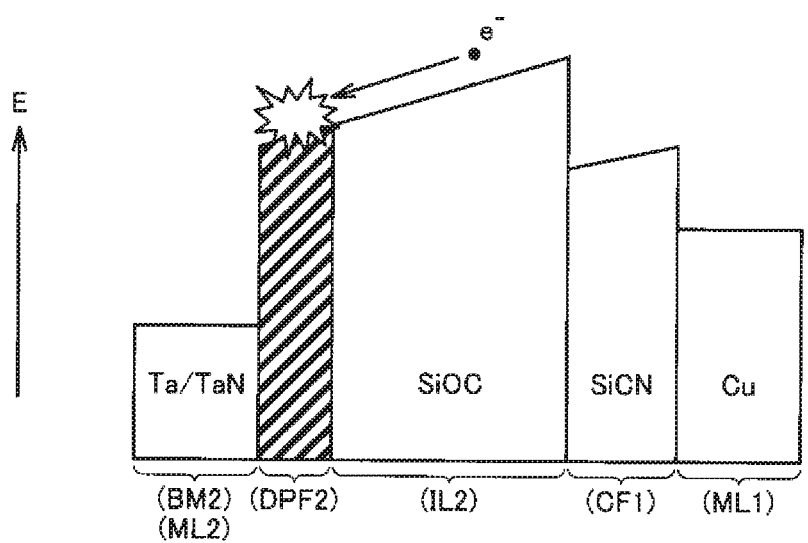
FIG. 18 is a diagram illustrating an energy band structure in the embodiment.

The inventors considered the results of evaluating this TDDB as follows. FIG. 18 shows the energy band structure between the lower layer wiring (corresponding to the first wiring ML1) and the upper layer wiring (corresponding to the second wiring ML2 and the second barrier metal film BM2) when the lower layer wiring is grounded and a positive voltage is applied to the upper layer wiring. As shown in FIG. 18, in the energy band structure of the interlayer insulating film corresponding to the second interlayer insulating film IL2 located between the lower layer wiring and the upper layer wiring, the energy band structure is inclined so as to decrease from the lower layer wiring side toward the upper layer wiring side.

Since positive voltage is applied to the upper layer wiring, electrons are injected from the lower layer wiring side to the upper layer wiring side. In the interlayer insulating film, which corresponds to the second interlayer insulating film IL2, electrons are accelerated by being inclined from the lower layer wiring side toward the upper layer wiring side. The reason why the reliability of the TDDB is lowered is considered to be that defects are formed in the interlayer insulating film by such accelerated electrons.

In the TEG, a defect formation preventing film having a larger amount of silicon-oxygen bonds with relatively high bonding energies is formed between a part of the interlayer insulating film located on the upper layer wiring where electrons are accelerated and the upper layer wiring. As a result, it is considered that the formation of defects by the accelerated electrons can be suppressed, and as a result, the lifetime can be extended.

On the other hand, in the energy band structure of the interlayer insulating film (corresponding to the second interlayer insulating film IL2) located between the potential layer wiring and the upper layer wiring when the lower layer wiring is grounded and a negative voltage is applied to the upper layer wiring, the energy band structure is inclined to decrease from the upper layer wiring side toward the lower layer wiring side. In the TEG, a defect formation preventing film is not formed between a portion of the interlayer insulating film located on the lower layer wiring side where electrons are accelerated and the lower layer wiring.

Therefore, although defects are formed in the interlayer insulating film by the accelerated electrons and the oxygen plasma treatment is performed, it is considered that the lifetime of the TEG in which the defect formation preventing film is not formed on the lower layer wiring is almost the same as the lifetime of the TEG in which the nitrogen plasma treatment is performed.

Thus, the inventors have demonstrated that the reliability of the TDDB between the upper layer wiring and the lower layer wiring has a dependence on the polarity, and have found a structure in which a defect formation preventing film is disposed on both the upper layer wiring side and the lower layer wiring side in order to solve the dependence on the polarity. As shown in FIG. 1, in the semiconductor device SDV, a first defect formation preventing film DPF1 is formed on the first wiring ML1 side, and a second defect formation preventing film DPF2 is formed on the second wiring ML2 side.

If the ratio of the infrared absorption intensity corresponding to the bonding between silicon and hydrogen to the infrared absorption intensity corresponding to the bonding between silicon and oxygen is defined as the abundance ratio, the abundance ratio in the first defect formation preventing film DPF1 is smaller than the abundance ratio in the second interlayer insulating film IL2. The abundance ratio in the second defect formation preventing film DPF2 is smaller than the abundance ratio in the second interlayer insulating film IL2.

Accordingly, it is considered that defects can be suppressed from being formed in portions such as the second interlayer insulating film IL2 located between the first wiring ML1 and the second wiring ML2 regardless of the polarities of the voltages applied to the first wiring ML1 and the second wiring ML2, and as a result, the reliability of the TDDB can be improved.

In the semiconductor device SDV described above, the first defect formation preventing film DPF1 is formed on the first wiring ML1 side and the second defect formation preventing film DPF2 is formed on the second wiring ML2 side, and in this respect, the semiconductor device SDV differs from the semiconductor device described in Japanese Unexamined Patent Application Publication No. 2013-93602 in which the reformed layer is formed on the wiring side of the upper layer. The semiconductor device SDV on which the first defect formation preventing film DPF1 and the second defect formation preventing film DPF2 are formed differ in structure from the semiconductor device on which the sidewall protective film is formed described in WO 2006/001356.

Further, the semiconductor device SDV on which the first defect formation preventing film DPF1 and the second defect formation preventing film DPF2 are formed differ in structures from the semiconductor device on which the modified layer described in Japanese Unexamined Patent Application Publication No. 2012-23245 is formed and the semiconductor device on which the modified layer described in Japanese Unexamined Patent Application Publication No. 2011-199059 is formed, respectively.

The semiconductor device described above includes a multi-layer wiring construction having a Low-k film. Here, variations of materials will be described. The first interlayer insulating film IL1 and the second interlayer insulating film IL2 are exemplified by a silicon oxycarbide film (SiOC). In addition, for example, a SiCOH film, a porous SiOC film, an HSQ (Hydrogen Silsesquioxane) film, or the like may be applied. Since the abundance ratio in each of the first defect formation preventing film DPF1 and the second defect formation preventing film DPF2 is smaller than the abundance ratio in these films, the reliability of the TDDB can be improved without dependency on polarities.

As the first barrier metal film BM1, a tantalum film (Ta) is exemplified. Alternatively, for example, a cobalt film (Co), a ruthenium film (Ru), a tungsten film (W), a manganese film (Mn), or the like may be used. Alternatively, a nitride film of each metal may be applied. Further, a film of a nitride of each metal may be applied.

As the second barrier metal film BM2, a tantalum film (Ta) is exemplified. Alternatively, for example, a tantalum nitride film (TaN), a cobalt film (Co), a ruthenium film (Ru), a tungsten film (W), a manganese film (Mn), or the like may be used. Alternatively, a nitride film of a cobalt film (Co), a ruthenium film (Ru), a tungsten film (W), or a manganese film (Mn) may be used. Further, a film of a silicon nitride of a cobalt film (Co), a ruthenium film (Ru), a tungsten film (W), or a manganese film (Mn) may be used.

A silicon carbonitride film (SiCN) is exemplified as each of the first cap insulating film CF1 and the second cap insulating film CF2. Alternatively, for example, a SiCO film or a SiN film may be applied. Alternatively, a multilayer film formed by stacking at least two films among the SiCN film, the SiCO film, and the SiN film may be used.

The basic structure of a semiconductor device with a first wiring and a second wiring according to first and second embodiments is described. Here, examples of main parts of a semiconductor device in which the basic structure is applied to a multilayered wiring structure of three or more layers will be described.

Figure 19:
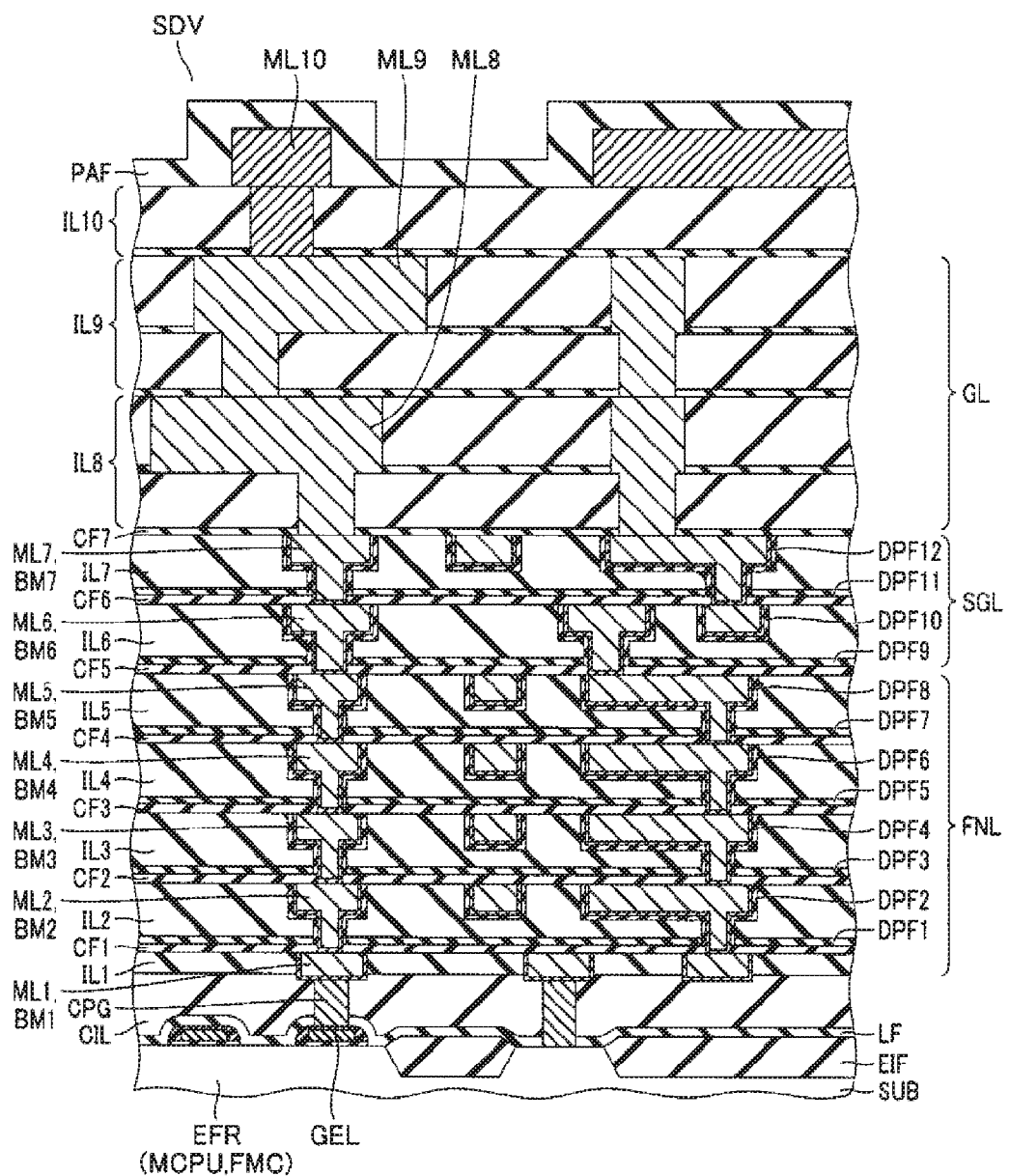
FIG. 19 is a cross-sectional view of a semiconductor device according to second embodiment.

As shown in FIG. 19, in the semiconductor device SDV, element region EFR is defined by element isolation insulating film EIF formed on the semiconductor substrate SUB. In the device area EFR, for example, gate electrodes GEL of a transistor constituting the flash memory FMC and gate electrodes GEL of a transistor constituting the microcomputer MCPU are formed.

A liner film LF and a contact interlayer insulating film CIL are formed so as to cover the gate electrode GEL and the like. The contact interlayer insulating film CIL is formed of, for example, an ordinary silicon oxide film (SiO2). The dielectric constant k of the contact interlayer insulating film CIL is, for example, about 4.2 to 4.3. A contact plug CPG is formed so as to penetrate the contact interlayer insulating film CIL and the like.

A first multilayer wiring portion FNL, a second multilayer wiring portion SGL, and a third multilayer wiring portion GL are formed on the contact interlayer insulating film CIL. The first multi-layer wiring unit FNL is also called, for example, a fine layer. The second multi-layer wiring unit SGL is also called a semi-global layer, for example. The third multi-layer wiring unit GL is also referred to as a global layer, for example.

The first multi-layer wiring unit FNL has a five-layer structure including a first wiring ML1, a second wiring ML2, a third wiring ML3, a fourth wiring ML4, and a fifth wiring ML5. The first wiring ML1 is formed in the wiring trench of the first interlayer insulating film IL1 with the first barrier metal film BM1 interposed therebetween. A first capping insulating film CF1 is formed so as to cover the first wiring ML1. The second wiring ML2 is formed in the wiring trench of the second interlayer insulating film IL2 with the second barrier metal film BM2 interposed therebetween. A second cap insulating film CF2 is formed so as to cover the second wiring ML2.

The third wiring ML3 is formed in the wiring trench of the third interlayer insulating film IL3 with the third barrier metal film BM3 interposed therebetween. A third capping insulating film CF3 is formed so as to cover the third wiring ML3. The fourth wiring ML4 is formed in the wiring trench of the fourth interlayer insulating film IL4 with the fourth barrier metal film BM4 interposed therebetween. A fourth cap insulating film CF4 is formed so as to cover the fourth wiring ML4. The fifth wiring ML5 is formed in the wiring trench of the fifth interlayer insulating film IL5 with the fifth barrier metal film BM5 interposed therebetween. A fifth capping insulating film CF5 is formed so as to cover the fifth wiring ML5.

Each of the first interlayer insulating film IL1 to the fifth interlayer insulating film IL5 is formed of, for example, a Low-k film such as a SiOC film. The dielectric constant k of each of the first interlayer insulating film IL1 to the fifth interlayer insulating film IL5 is, for example, about 2.5 to 2.7. In each of the first wiring ML1 to the fifth wiring ML5, the wiring pitches are, for example, about 64 nm to 126 nm.

A first defect formation preventing film DPF1 and a second defect formation preventing film DPF2 are formed between the first wiring ML1 and the second wiring ML2. The first defect formation preventing film DPF1 is formed between the first wiring ML1 and the second interlayer insulating film IL2. The second defect formation preventing film DPF2 is formed between the second interlayer insulating film IL2 and the second wiring ML2.

A third defect formation preventing film DPF3 and a fourth defect formation preventing film DPF4 are formed between the second wiring ML2 and the third wiring ML3. The third defect formation preventing film DPF3 is formed between the second wiring ML2 and the third interlayer insulating film IL3. The fourth defect formation preventing film DPF4 is formed between the third interlayer insulating film IL3 and the third wiring ML3.

A fifth defect formation preventing film DPF5 and a sixth defect formation preventing film DPF6 are formed between the third wiring ML3 and the fourth wiring ML4. The fifth defect formation preventing film DPF5 is formed between the third wiring ML3 and the fourth interlayer insulating film IL4. The sixth defect formation preventing film DPF6 is formed between the fourth interlayer insulating film IL4 and the fourth wiring ML4.

A seventh defect formation preventing film DPF7 and an eighth defect formation preventing film DPF8 are formed between the fourth wiring ML4 and the fifth wiring ML5. The seventh defect formation preventing film DPF7 is formed between the fourth wiring ML4 and the fifth interlayer insulating film IL5. The eighth defect formation preventing film DPF8 is formed between the fifth interlayer insulating film IL5 and the fifth wiring ML5.

The first defect formation preventing film DPF1 is formed by, for example, performing an oxygen-plasma treatment on a silicon oxycarbide film (SiOC). The second defect formation preventing film DPF2 is formed by performing oxygen-plasma treatment on the second interlayer insulating film IL2 in which the wiring trench is formed. The third defect formation preventing film DPF3 and the fourth defect formation preventing film DPF4, the fifth defect formation preventing film DPF5 and the sixth defect formation preventing film DPF6, and the seventh defect formation preventing film DPF7 and the eighth defect formation preventing film DPF8 are also formed in the same manner as the first defect formation preventing film DPF1 and the second defect formation preventing film DPF2.

The second multi-layer wiring unit SGL has a two-layer structure including a sixth wiring ML6 and a seventh wiring ML7. The sixth wiring ML6 is formed in the wiring trench of the sixth interlayer insulating film IL6 with the sixth barrier metal film BM6 interposed therebetween. A sixth capping insulating film CF6 is formed so as to cover the sixth wiring ML6. The seventh wiring ML7 is formed in the wiring trench of the seventh interlayer insulating film IL7 with the seventh barrier metal film BM7 interposed therebetween. A seventh capping insulating film CF7 is formed so as to cover the seventh wiring ML7.

Each of the sixth interlayer insulating film IL6 and the seventh interlayer insulating film IL7 is formed of, for example, a Low-k film such as a SiOC film. The dielectric constant k of each of the sixth interlayer insulating film IL6 and the seventh interlayer insulating film IL7 is greater than the dielectric constant k of each of the first interlayer insulating film IL1 to the fifth interlayer insulating film IL5, and is, for example, about 2.9 to 3.0. In each of the sixth wiring ML6 and the seventh wiring ML7, the wiring pitch is wider than the wiring pitch of each of the first wiring ML1 to the fifth wiring ML5, e.g., about 126 nm to 252 nm.

A ninth defect formation preventing film DPF9 and a tenth defect formation preventing film DPF10 are formed between the fifth wiring ML5 and the sixth wiring ML6. The ninth defect formation preventing film DPF9 is formed between the fifth wiring ML5 and the sixth interlayer insulating film IL6. The tenth defect formation preventing film DPF10 is formed between the sixth interlayer insulating film IL6 and the sixth wiring ML6. An eleventh defect formation preventing film DPF11 and a twelfth defect formation preventing film DPF12 are formed between the sixth wiring ML6 and the seventh wiring ML7. The eleventh defect formation preventing film DPF11 is formed between the sixth wiring ML6 and the seventh interlayer insulating film IL7. The twelfth defect formation preventing film DPF12 is formed between the seventh interlayer insulating film IL7 and the seventh wiring ML7.

The ninth defect formation preventing film DPF9 is formed by, for example, performing an oxygen-plasma treatment on a silicon oxycarbide film (SiOC). The tenth defect formation preventing film DPF10 is formed by performing oxygen-plasma treatment on the sixth interlayer insulating film IL6 in which the wiring trench is formed. The eleventh defect formation b1 preventing film DPF11 and the twelfth defect formation preventing film DPF12 are also formed in the same manner as the ninth defect formation preventing film DPF9 and the tenth defect formation preventing film DPF10.

The third multi-layer wiring unit GL has a two-layer structure including an eighth wiring ML8 and a ninth wiring ML9. The eighth wiring ML8 is formed in the wiring trench of the eighth interlayer insulating film IL8. The ninth wiring ML9 is formed in the wiring trench of the ninth interlayer insulating film IL9. Each of the eighth interlayer insulating film IL8 and the ninth interlayer insulating film IL9 is formed of, for example, an ordinary silicon oxide film (SiO2). The dielectric constant k of each of the eighth interlayer insulating film IL8 and the ninth interlayer insulating film IL9 is, for example, about 4.2 to 4.3.

Further, a tenth interlayer insulating film IL10 is formed so as to cover the third multi-layer wiring portion GL. A tenth wiring ML10 is formed on the tenth interlayer insulating film IL10. A passivating film PAF is formed so as to cover the tenth wiring ML10 of the passivating film PAF. A semiconductor device with a multi-layer wiring construction is constructed as described above.

As described above, the ratio of the integrated absorption intensity of infrared rays corresponding to the bond between silicon and hydrogen to the integrated absorption intensity of infrared rays corresponding to the bond between silicon and oxygen is defined as the abundance ratio (Si—H/Si—O). In the first multilayer wiring portion FNL of the semiconductor device SDV having the multilayer wiring structure described above, the abundance ratio in the first defect formation preventing film DPF1 is smaller than the abundance ratio in the second interlayer insulating film IL2. The abundance ratio in the second defect formation preventing film DPF2 is smaller than the abundance ratio in the second interlayer insulating film IL2.

Similarly, the abundance ratio in each of the third defect formation preventing film DPF3 and the fourth defect formation preventing film DPF4 is smaller than the abundance ratio in the third interlayer insulating film IL3. The abundance ratio in each of the fifth defect formation preventing film DPF5 and the sixth defect formation preventing film DPF6 is also smaller than the abundance ratio in the fourth interlayer insulating film IL4. The abundance ratio in each of the seventh defect formation preventing film DPF7 and the eighth defect formation preventing film DPF8 is also smaller than the abundance ratio in the fifth interlayer insulating film IL5.

In the second multi-layer wiring portion SGL, the abundance ratio in the ninth defect formation preventing film DPF9 is smaller than the abundance ratio in the sixth interlayer insulating film IL6. The abundance ratio in the tenth defect formation preventing film DPF10 is smaller than the abundance ratio in the sixth interlayer insulating film IL6. Similarly, the abundance ratio in each of the eleventh defect formation preventing film DPF11 and the twelfth defect formation preventing film DPF12 is smaller than the abundance ratio in the seventh interlayer insulating film IL7.

As a result, it is possible to suppress defects from being formed in portions such as the second interlayer insulating film IL2 to the fifth interlayer insulating film IL5 regardless of the polarities of the voltages applied to the first wiring ML1 to the fifth wiring ML5, respectively, in the same manner as described in first embodiment. In addition, irrespective of the polarities of the voltages applied to the sixth wiring ML6 and the seventh wiring ML7, it is possible to suppress defects from being formed in portions such as the sixth interlayer insulating film IL6 and the seventh interlayer insulating film IL7. As a result, the reliability of the TDDB can be improved.

As materials of the first interlayer insulating film IL1 to the seventh interlayer insulating film IL7, the Low-k film described in first embodiment can be applied according to the specifications of semiconductor device. In addition, as the materials of the first barrier metal film BM1 to the seventh barrier metal film BM7 and the first cap insulating film CF1 to the seventh cap insulating film CF7, various materials described in first embodiment can be applied according to the specifications of the semiconductor device.

The semiconductor device described in the respective embodiments can be variously combined as required.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
    a first wiring formed in a first trench of a first interlayer insulating film;
    a second wiring formed in a second trench of a second interlayer insulating film and disposed over the first wiring;
    a first defect formation preventing film formed between the first wiring and the second interlayer insulating film; and
    a second defect formation preventing film formed between the second interlayer insulating film and the second wiring, wherein, when a ratio of an infrared absorption intensity corresponding to a bond between silicon and hydrogen to an infrared absorption intensity corresponding to a bond between silicon and oxygen bond is defined as an abundance ratio:
        the abundance ratio in the first defect formation preventing film is smaller than the abundance ratio in the second interlayer insulating film; and
        the abundance ratio in the second defect formation preventing film is smaller than the abundance ratio in the second interlayer insulating film.

2. The semiconductor device according to claim 1,
    wherein the first defect formation preventing film is formed such that the first defect formation preventing film faces an upper surface of the first wiring, and
    wherein the second defect formation preventing film is formed such that the second defect formation preventing film faces both side surfaces and a lower surface of the second wiring.

3. The semiconductor device according to claim 2, comprising:
    a semiconductor substrate disposed below the first wiring; and
    a contact interlayer insulating film formed between the semiconductor substrate and the first interlayer insulating film such that the contact interlayer insulating film covers the semiconductor substrate,
    wherein the contact interlayer insulating film has a first dielectric constant,
    wherein the first interlayer insulating film has a second dielectric constant lower than the first dielectric constant, and
    wherein the second interlayer insulating film has a third dielectric constant lower than the first dielectric constant.

4. The semiconductor device according to claim 3, comprising:
    a third wiring disposed over the second wiring and formed in a third trench of a third interlayer insulating film;
    a fourth wiring disposed over the third wiring and formed in a fourth trench of a fourth interlayer insulating film;
    a third defect formation preventing film formed between the third wiring and the fourth interlayer insulating film; and
    a fourth defect formation preventing film formed between the fourth interlayer insulating film and the fourth wiring,
    wherein the abundance ratio in the third defect formation preventing film is smaller than the abundance ratio in the fourth interlayer insulating film, and
    wherein the abundance ratio in the fourth defect formation preventing film is smaller than the abundance ratio in the fourth interlayer insulating film.

5. The semiconductor device according to claim 4,
    wherein the third interlayer insulating film has a fourth dielectric constant smaller than the first dielectric constant and greater than the second dielectric constant and the third dielectric constant, and
    wherein the fourth interlayer insulating film has a fifth dielectric constant lower than the first dielectric constant and greater than the second dielectric constant and the third dielectric constant.

6. The semiconductor device according to claim 4,
    wherein the third defect formation preventing film is formed such that the third defect formation preventing film faces an upper surface of the third wiring, and wherein the fourth defect formation preventing film is formed such that the fourth defect formation preventing film faces both side surfaces and the lower surface of the fourth wiring.

7. The semiconductor device according to claim 1, wherein the second interlayer insulating film comprises a silicon oxycarbide (SiOC) film.

8. The semiconductor device according to claim 1, wherein the second wiring is formed above the first wiring.

9. A method of manufacturing a semiconductor device, the method comprising:
   forming a first wiring in a first trench;
   forming a first insulating film so as to cover the first wiring;
   forming a first defect formation preventing film by performing a first plasma treatment on the first insulating film;
   forming a second interlayer insulating film having a second trench so as to cover the first defect formation preventing film;
   forming a second defect formation preventing film by performing a second plasma treatment on the second interlayer insulating film; and
   forming a second wiring in the second trench,
   wherein a ratio of an infrared absorption intensity corresponding to a bond between silicon and hydrogen to an infrared absorption intensity corresponding to a bond of silicon and oxygen is set as an abundance ratio,
   wherein the first defect formation preventing film is formed such that the abundance ratio in the first defect formation preventing film is smaller than the abundance ratio in second interlayer insulating film, in the forming the first defect formation preventing film, and
   wherein the second defect formation preventing film is formed such that the abundance ratio in the second defect formation preventing film is smaller than the abundance ratio in second interlayer insulating film, in the forming the second defect formation preventing film.

10. The method of manufacturing the semiconductor device according to claim 9, wherein each of the first plasma treatment and the second plasma treatment is performed using plasma generated from a gas containing at least one of an oxygen atom or a carbon atom.

11. The method of manufacturing the semiconductor device according to claim 10, wherein at least one of an oxygen gas or a carbon dioxide gas is used as the gas.

12. The method of manufacturing the semiconductor device according to claim 9, wherein the forming the second interlayer insulating film comprises forming a silicon oxycarbide (SiOC) film as the second interlayer insulating film.

* * * * *